United States Patent
Li et al.

(10) Patent No.: US 11,430,710 B2
(45) Date of Patent: Aug. 30, 2022

(54) LID/HEAT SPREADER HAVING TARGETED FLEXIBILITY

(71) Applicant: INTERNATIONAL BUSINESS MACHINES CORPORATION, Armonk, NY (US)

(72) Inventors: Shidong Li, Hopewell Junction, NY (US); Jay A. Bunt, Esopus, NY (US); Kenneth C. Marston, Poughquag, NY (US); Hilton Toy, Hopewell Junction, NY (US); Hongqing Zhang, Hopewell Junction, NY (US); David J. Lewison, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 16/773,937

(22) Filed: Jan. 27, 2020

(65) Prior Publication Data
US 2021/0233825 A1   Jul. 29, 2021

(51) Int. Cl.
*H01L 23/367* (2006.01)
*H01L 23/00* (2006.01)
*H01L 25/065* (2006.01)
*H01L 23/04* (2006.01)

(52) U.S. Cl.
CPC .......... *H01L 23/3675* (2013.01); *H01L 24/32* (2013.01); *H01L 25/0655* (2013.01); *H01L 23/04* (2013.01); *H01L 23/562* (2013.01); *H01L 2224/32245* (2013.01); *H01L 2924/35121* (2013.01)

(58) Field of Classification Search
CPC . H01L 23/3675; H01L 24/32; H01L 25/0655; H01L 2924/35121; H01L 2224/32245; H01L 23/562; H01L 23/04
See application file for complete search history.

(56) References Cited

U.S. PATENT DOCUMENTS

| | | | |
|---|---|---|---|
| 6,607,942 B1 | 8/2003 | Tsao et al. | |
| 7,007,741 B2 | 3/2006 | Sen et al. | |
| 8,436,454 B2 | 5/2013 | Norman | |
| 8,559,181 B2 | 10/2013 | Clayton | |
| 9,437,519 B2 * | 9/2016 | McVicker | ............... H01L 23/04 |
| 2006/0098411 A1 | 5/2006 | Lee et al. | |
| 2008/0128897 A1 | 6/2008 | Chao | |
| 2009/0045505 A1 | 2/2009 | Hsu | |

(Continued)

FOREIGN PATENT DOCUMENTS

WO    2018119153 A2    6/2018

OTHER PUBLICATIONS

Anonymous, "Method for a compliant integrated heat spreader", IPCOM000145784D, Jan. 26, 2007.

(Continued)

*Primary Examiner* — Patricia D Valenzuela
(74) *Attorney, Agent, or Firm* — L. Jeffrey Kelly

(57) ABSTRACT

An electronic apparatus that includes a semiconductor device; an electronic packaging substrate for receiving the semiconductor device; a thermal interface material on the semiconductor device; and a lid in contact with the thermal interface material and having a zone of targeted flexibility spaced from the semiconductor device.

20 Claims, 7 Drawing Sheets

(56) References Cited

U.S. PATENT DOCUMENTS

| | | | |
|---|---|---|---|
| 2012/0114927 A1* | 5/2012 | Khaselev | H01L 21/78 |
| | | | 428/220 |
| 2014/0091461 A1* | 4/2014 | Shen | H01L 21/563 |
| | | | 257/737 |
| 2016/0155682 A1* | 6/2016 | Ahuja | H01L 25/50 |
| | | | 438/122 |
| 2018/0254234 A1 | 9/2018 | Limaye et al. | |
| 2018/0331011 A1 | 11/2018 | Rivera et al. | |

OTHER PUBLICATIONS

Anonymous, "Method for a flexible integrated heat spreader for multiple-chip packages", IPCOM000137870D, Jun. 29, 2006.

* cited by examiner

LID/HEAT SPREADER HAVING TARGETED FLEXIBILITY

BACKGROUND

The present exemplary embodiments generally relate to electronic apparatus and, more particularly, relate to heat spreader lids and package assemblies including a heat spreader lid.

Industry practice in the field of semiconductor packaging is to mount one or more semiconductor chips to redistribution circuitry, which could be provided in the form of a multilayer organic laminate. The chip generates heat when powered in operation. Thermal management of the package may require some type of thermal management mechanism mounted to the chip to extract and dissipate the generated heat. Absent effective heat dissipation, the generated heat can reduce chip performance, decrease reliability, and reduce the useful lifetime of the chip.

The demand for higher performance and integration of memory with logic drives the need for larger silicon chips. The increase in chip size not only impacts chip package interaction, but also sets a challenge for semiconductor manufacturing as large chip area requires an absence of circuit defects over that area, which adversely impacts the yield of the chips.

In response to the challenge of manufacturing large chips, it has been proposed to revert to multi-chip modules by electrically "stitching" multiple smaller chips together instead of manufacturing a large monolithic chip.

BRIEF SUMMARY

The various advantages and purposes of the exemplary embodiments as described above and hereafter are achieved by providing, according to an aspect of the exemplary embodiments, an electronic apparatus comprising: a semiconductor device; an electronic packaging substrate for receiving the semiconductor device; a thermal interface material on the semiconductor device; a lid in contact with the thermal interface material and having a zone of targeted flexibility spaced from the semiconductor device.

According to another aspect of the exemplary embodiments, there is provided an electronic apparatus comprising: a plurality of semiconductor devices; an electronic packaging substrate for receiving the plurality of semiconductor devices, the plurality of semiconductor devices placed closely to one another so that a gap between a pair of semiconductor devices is between 0.5 and 3 mm; a thermal interface material on the plurality of semiconductor devices, the thermal interface material chosen so as to be flexible up to a joining temperature of the plurality of semiconductor devices to the electronic packaging substrate; a lid having at least one zone of targeted flexibility in contact with the thermal interface material such that the zone of targeted flexibility is directly over the gap between the pair of semiconductor devices.

According to a further aspect of the exemplary embodiments, there is provided an electronic apparatus comprising: at least one semiconductor device; an electronic packaging substrate for receiving the at least one semiconductor device; a thermal interface material on the at least one semiconductor device, the thermal interface material chosen so as to be flexible up to a joining temperature of the at least one semiconductor device to the electronic packaging substrate; a lid in contact with the thermal interface material and having a zone of targeted flexibility such that the zone of targeted flexibility is directly over the at least one semiconductor device.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 8 to 11 are cross sectional views to illustrate another exemplary embodiment in which one or more slots in the lid provide at least one zone of reduced bending rigidity wherein:

FIG. 8 illustrates a slot in an underside of the lid facing the thermal interface materials.

FIG. 9 illustrates a slot in a topside of the lid facing away from the thermal interface materials.

FIG. 10 illustrates slots in the underside and topside of the lid.

FIG. 11 illustrates unfilled slots in the underside and topside of the lid.

FIGS. 12 to 14 illustrate another exemplary embodiment in which one or more slots in the lid provide at least one zone of reduced bending rigidity wherein:

FIG. 12 is a cross sectional view that illustrates a slot in the topside of the lid over each of the semiconductor chips.

FIG. 13 is a cross sectional view that illustrates a filled slot in the topside of the lid over each of the semiconductor chips.

FIG. 14 is a plan view of the multi-chip module of FIG. 12.

FIGS. 15 to 18 are cross sectional views to illustrate another exemplary embodiment in which one or more slots in the lid provide at least one zone of reduced bending rigidity wherein:

FIG. 15 illustrates a slot in the topside of the lid over each of the semiconductor chips and a slot in an underside of the lid facing the thermal interface materials.

FIG. 16 illustrates a slot in the topside of the lid over each of the semiconductor chips and a slot in a topside of the lid facing away from the thermal interface materials.

FIG. 17 illustrates a slot in the topside of the lid over each of the semiconductor chips, a slot in an underside of the lid and a slot in a topside of the lid.

FIG. 18 is the multi-chip module of FIG. 17 without any of the slots being filled.

FIGS. 19 to 21 illustrate an exemplary embodiment of a single-chip module in which one or more slots in the lid provide at least one zone of reduced bending rigidity wherein:

FIG. 19 is a side view of the single-chip module showing one zone of targeted flexibility in a foot area of the lid.

FIG. 20 is a perspective view of the lid of the single-chip module of FIG. 19 wherein the lid is tilted to show the top of the lid.

FIG. 21 is a perspective view of the lid of the single-chip module of FIG. 19 wherein the lid is tilted to show the bottom of the lid.

DETAILED DESCRIPTION

For multi-chip modules to compete with a single-chip module in performance, the smaller chips need to be packaged very compactly because data bandwidth and communication reliability degrade rapidly with the chip-to-chip distance.

The present inventors have recognized that with chips closely packed together comes the challenge to maintain the structural integrity of the thermal interface material between the chips and the lid. The present inventors have further recognized that the thermal interface material may be subject to peeling at the inner edges where adjacent chips are in close proximity.

Figure 1:
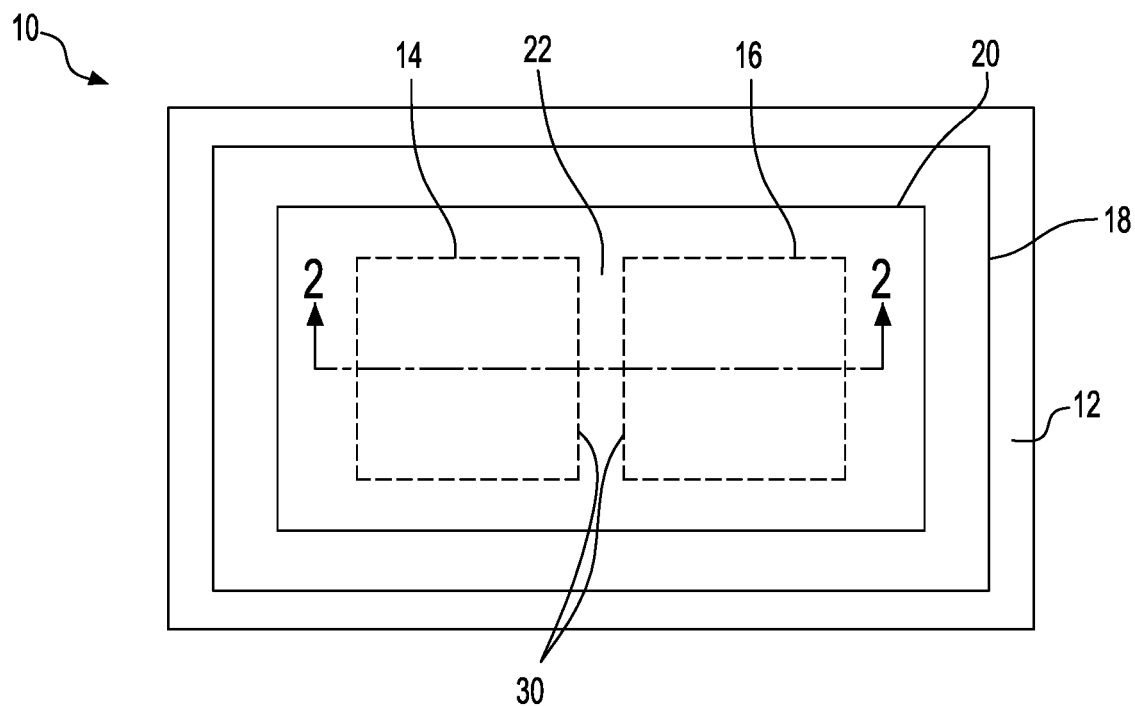
FIG. 1 a plan view of a dual-chip module.

Referring to the Figures in more detail, there is disclosed in FIG. 1 a plan view of a multi-chip module 10 including an electronics substrate 12, such as an organic laminate material, chips 14, 16 and lid 18 covering the chips 14, 16. The lid 18 may be attached to the electronics substrate 12 by a seal band 20. The lid 18 is typically a rigid metallic material such as copper or aluminum.

The chips 14, 16 need to be packaged very compactly so there is a small gap 22 separating the chips 14, 16. The gap may be about 0.5 millimeters (mm) to 3 mm.

Figure 2:
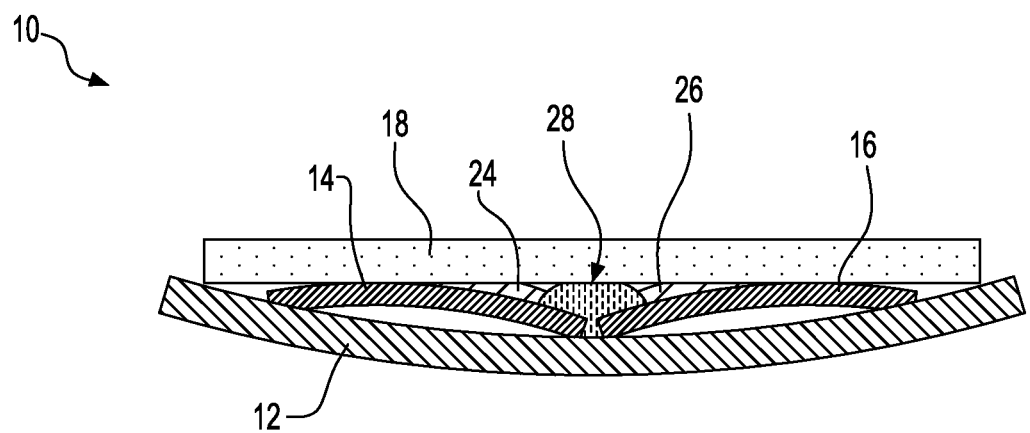
FIG. 2 is a cross sectional view of the dual-chip module of FIG. 1.

Referring now to FIG. 2, there is illustrated a cross sectional view of the multi-chip module 10 of FIG. 1. Additionally shown in FIG. 2, are the thermal interface materials 24, 26 located between the chips 14, 16, respectively, and the lid 18.

The inventors have found that there is a high peeling effect 28 of the thermal interface material (TIM) 24, 26 at the inner edges 30 of the chips 14, 16. The TIM 24, 26 serves as a structural component to pull the lid 18 and electronic substrate 12 together. Catastrophic failure of the multi-chip module 10 may occur when the TIM 24, 26 starts to peel as shown at 28 in FIG. 2. Accordingly, it is proposed to provide another structural component to prevent buckling of the multi-chip module 10.

The exemplary embodiments pertain to providing a lid having at least one zone of targeted flexibility so as to reduce the peeling effect of the peeling of the TIM 24, 26 at the inner edges 30 of the chips 14, 16. The exemplary embodiments disclose specially-designed and targeted flexible areas at precise locations to improve TIM peeling strain.

It should be understood that the exemplary embodiments are applicable to embodiments in which the TIM 24, 26 may differ in thickness and similarly, the chips 14, 16 may differ in thickness.

Figure 3:
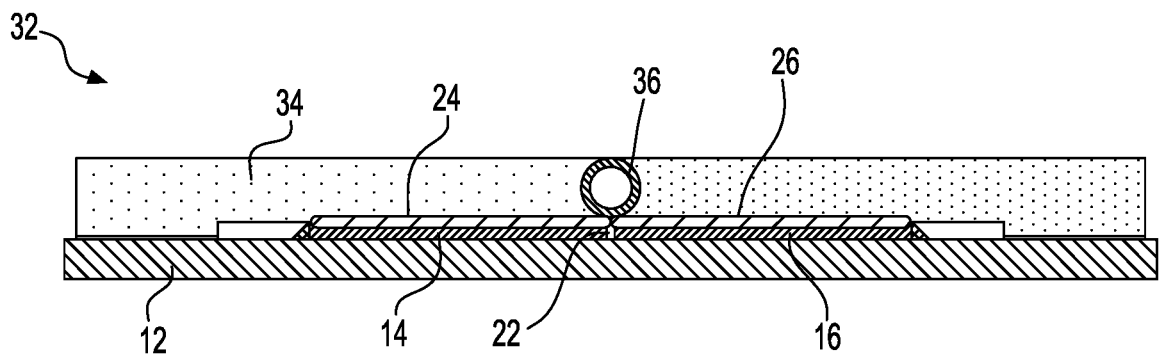
FIG. 3 is a cross sectional view of one exemplary embodiment in which the lid of the multi-chip module comprises a hinge.

Referring now to FIG. 3, there is disclosed one exemplary embodiment where the modified lid 34 provides structural support to the multi-chip module 32 to substantially lessen the effect of the TIM peeling. The lid 34 contains a hinge 36 over the gap 22 between the chips 14, 16.

Figure 4:
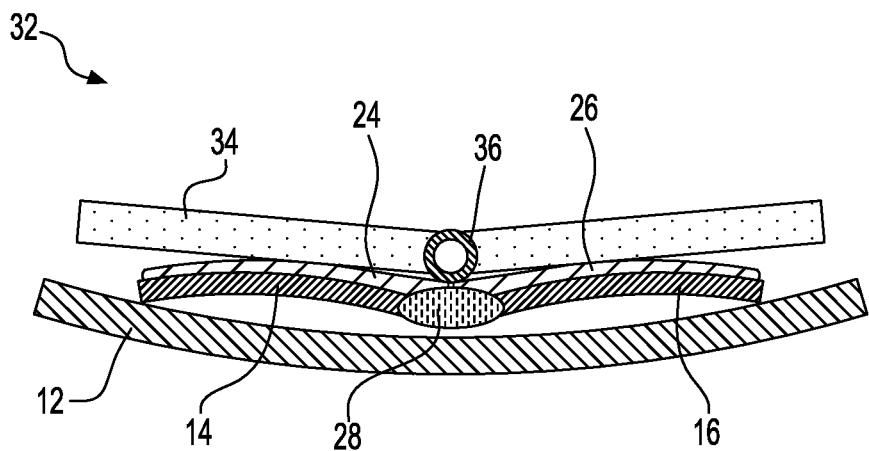
FIG. 4 illustrates the one exemplary embodiment of the multi-chip module in FIG. 3 having a reduced peeling effect of the thermal interface materials in the multi-chip module.

FIG. 4 illustrates the modified lid 34 with respect to the TIMs 24, 26. Due to the hinged lid 34, the lid 34 is able to more closely conform to the TIM, thereby substantially reducing the TIM peeling effect 28. The warpage of the lid 34 is shown greatly exaggerated in FIG. 4 but any of the warpage can be absorbed by the usually thicker TIM (not shown) between the lid 34 and the heatsink (not shown) that is subsequently placed on the lid 34.

Figure 5:
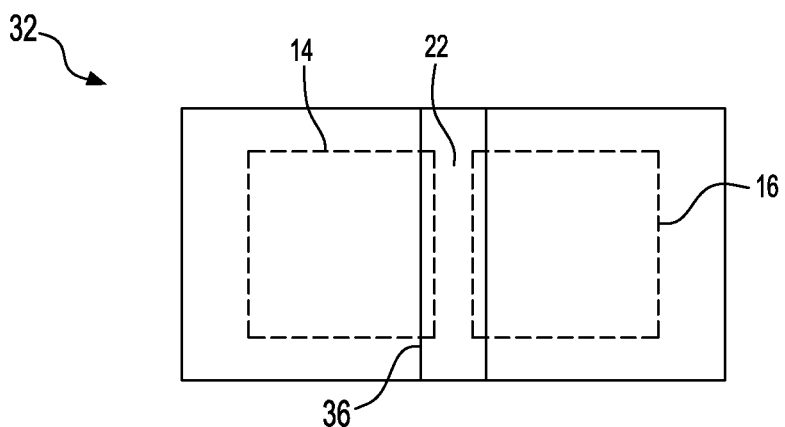
FIG. 5 is a plan view of the multi-chip module of FIG. 3.

FIG. 5 is a plan view of multi-chip module 32. Hinge 36 may extend entirely across the lid 34. Hinge 36 also bridges the gap 22 between the semiconductor chips 14, 16.

Figure 6:
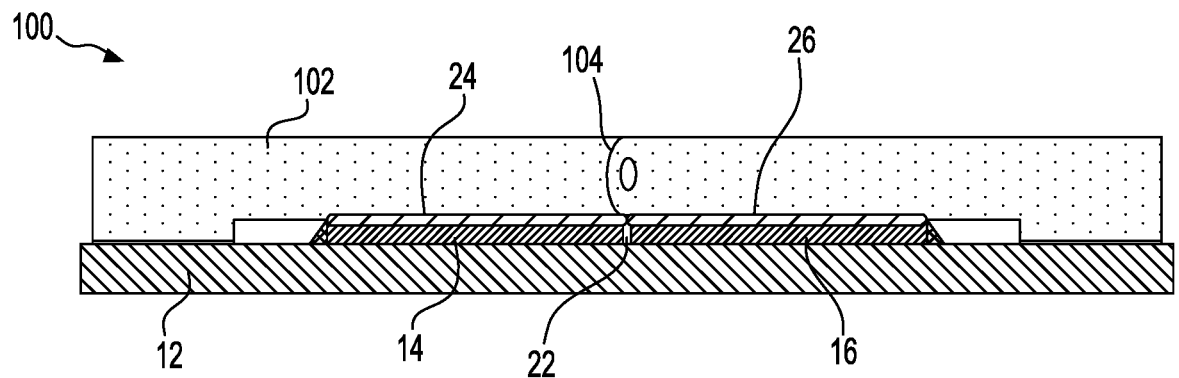
FIG. 6 illustrates a cross sectional view of another exemplary embodiment in which the lid of a multi-chip module comprises a hinge.
Figure 7:
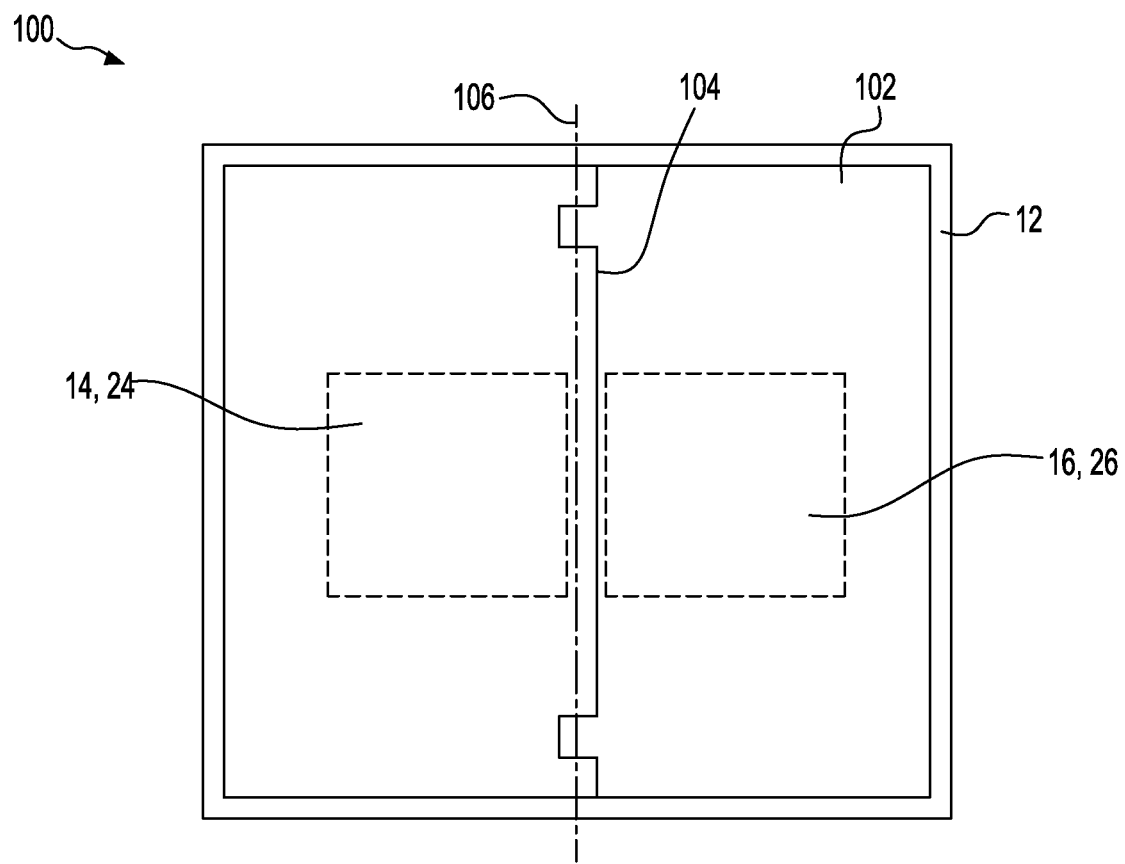
FIG. 7 is a plan view of the multi-chip module of FIG. 6.

FIGS. 6 and 7 illustrate another exemplary embodiment of a modified lid 102 that provides structural support to multi-chip module 100 to substantially lessen the effect of the TIM peeling. The lid 102 contains a hinge 104 over the gap 22 between the chips 14, 16. Also shown in FIG. 6 are TIMs 24, 26.

FIG. 7 is a plan view of multi-chip module 100 showing the hinge 104 that may extend entirely across the lid 102. Hinge 104 has a centerline 106 in the gap 22 between the chips 14, 16.

FIGS. 8 to 11 are cross sectional views that disclose another exemplary embodiment in which one or more slots in the lid provide at least one zone of reduced bending rigidity.

Figure 8:
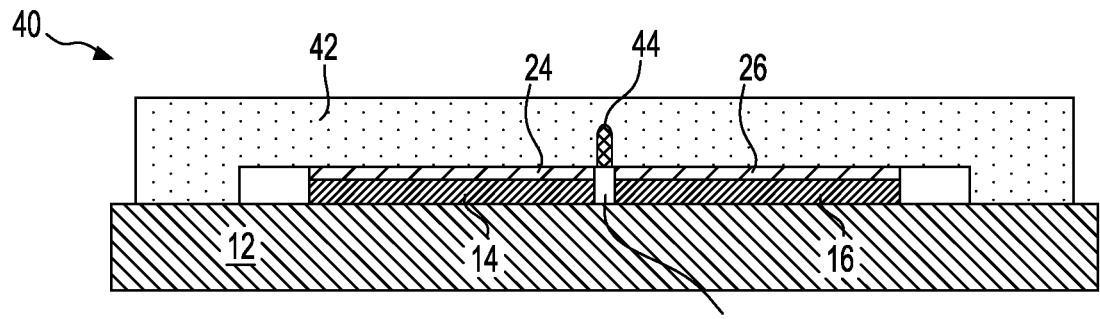

The one or more slots may be 30 to 90% of the thickness of the lid. In FIG. 8, multi-chip module 40 contains a slot 44 in the underside of the lid 42, that is, the side facing the TIMs 24, 26 and chips 14, 16. The slot 44 is over the gap 22 between the chips 14, 16. The slot 44 may extend entirely across the width of the lid 42.

Figure 9:
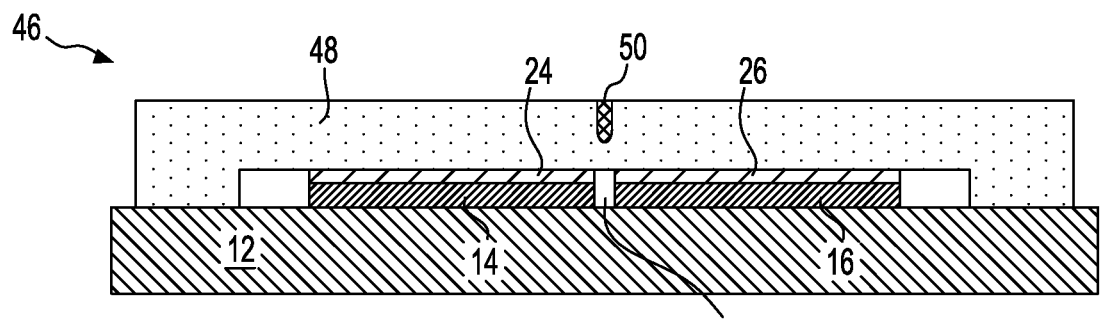

In FIG. 9, multi-chip module 46 contains a slot 50 in the topside of the lid 48, that is, the side facing away from the TIMs 24, 26 and chips 14, 16. The slot 50 is over the gap 22 between the chips 14, 16. The slot 50 may extend entirely across the width of the lid 48.

Figure 10:
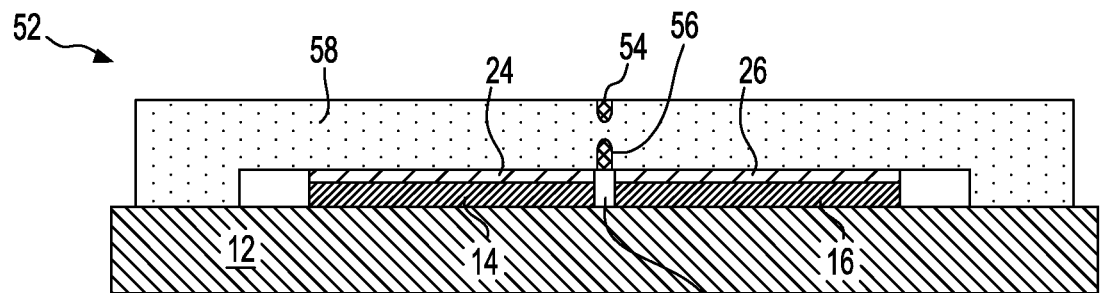
Figure 11:
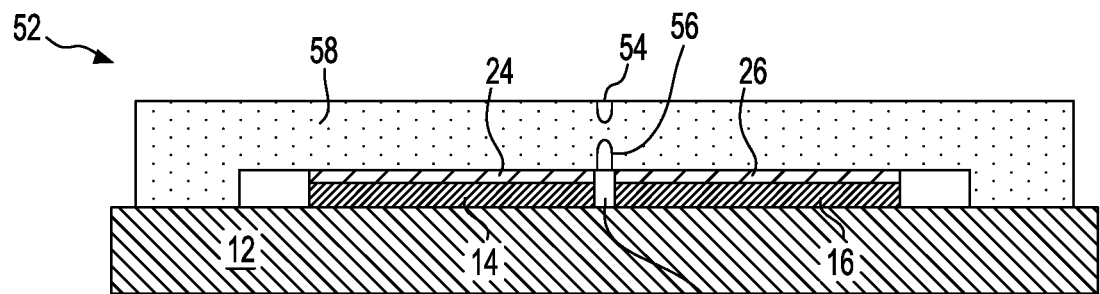

In FIG. 10, multi-chip module 52 contains a slot 54 in the topside of the lid 58 and a slot 56 in the underside of the lid 58. The slots 54, 56 are over the gap 22 between the chips 14, 16. The slots 54, 56 may extend entirely across the width of the lid 58. As there are two slots 54, 56 which oppose one another, the total combined depth of slots 54, 56 may be 30 to 90% of the thickness of the lid 58.

In each of FIGS. 8 to 10, the slots 44, 50, 54, 56 may be filled with a softer material such as indium, thermal grease or thermal gel. It is within the scope of the exemplary embodiments that the slots 44, 50, 54, 56 may be unfilled. In one exemplary embodiment illustrated in FIG. 11, the multi-chip module 52 with slots 54, 56 in lid 58 is shown with the slots 54, 56 being unfilled. Although not shown, slot 44 in lid 42 in FIG. 8 and slot 50 in lid 48 in FIG. 9 may also be unfilled.

Figure 12:
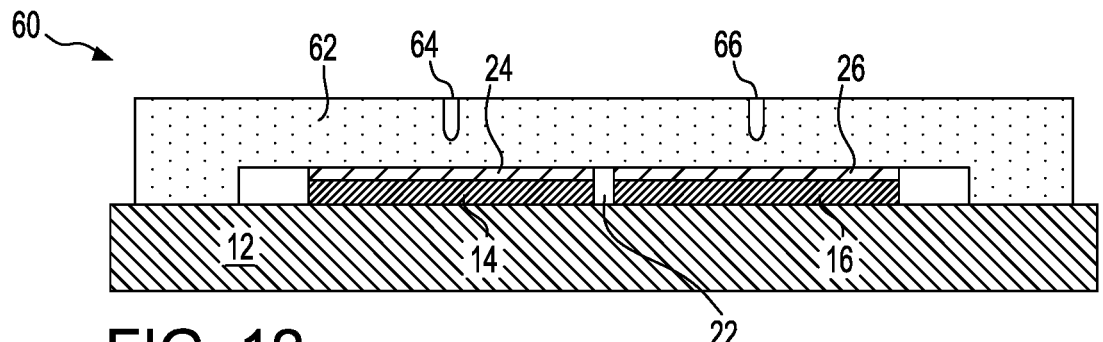

Referring now to FIG. 12, there is a cross sectional view of another exemplary embodiment in which one or more slots in the lid provide at least one zone of reduced bending rigidity.

Multi-chip module 60 contains slots 64, 66 in the topside of the lid 62. As shown in the cross sectional view of FIG. 13, these slots 64, 66 may also be filled with a thermal grease or a thermal gel or a soft metal such as indium. Even if originally unfilled, the slots 64, 66 may become filled when the next layer of TIM (not shown) is deposited on the lid 62 prior to placement of a heatsink (not shown).

The slots 64, 66 should only be on the top side of the lid 62. Placing the slots on the underside of the lid 62 is not favored as it reduces the interface between the TIMs 24, 26 and the semiconductor chips 14, 16, thereby reducing the ability to transfer heat from the semiconductor chips 14, 16 into the lid 62.

Figure 14:
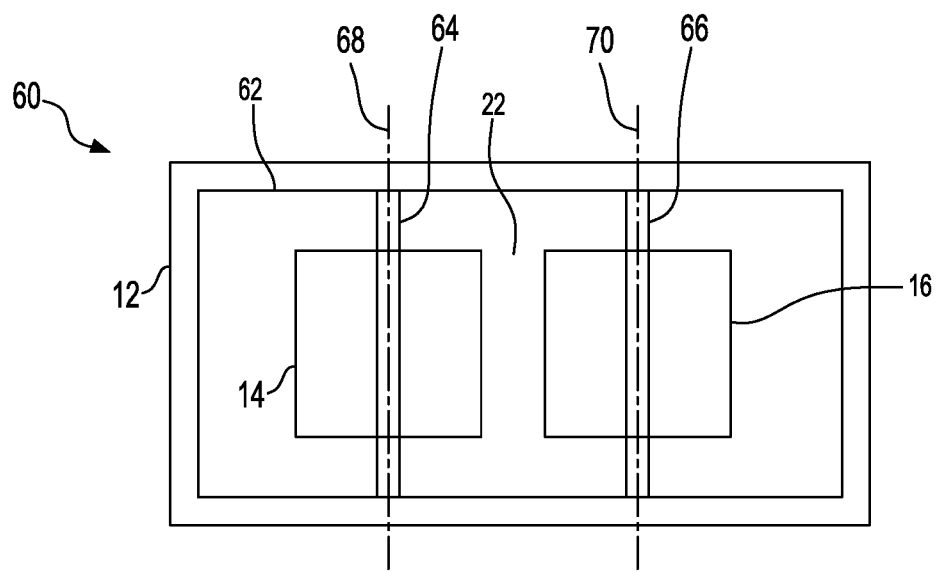

Referring now to FIG. 14, there is illustrated a plan view of multi-chip module 60. It is noted that slots 64, 66 may traverse the entire width of the lid 62 but should be at least as long as the width of the semiconductor chips 14, 16. Importantly, the slots 64, 66 are placed at the centerlines 68, 70 of the semiconductor chips 14, 16. The centerlines 68, 70 essentially divide each of the semiconductor chips 14, 16 in half.

Figure 13:
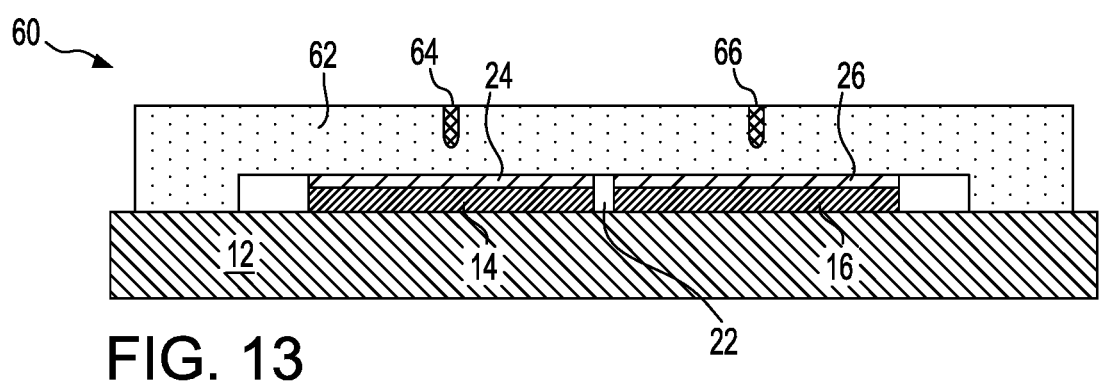

While FIGS. 12 to 14 are illustrated with a plurality of semiconductor chips, it should be understood that the exemplary embodiment illustrated in FIGS. 12 to 14 is applicable to a single chip module as well.

Referring now to FIGS. 15 to 18, there are cross sectional views of another exemplary embodiment in which one or more slots in the lid provide at least one zone of reduced bending rigidity. The exemplary embodiment in FIGS. 15 to 18 are the most preferred exemplary embodiment for a multi-chip module in that slots over the gap between the semiconductor chips, as illustrated in FIGS. 8 to 11, are combined with slots over the centerlines of the semiconductor chips, as illustrated in FIGS. 12 to 14 to result in the best reduction of the TIM peeling effect.

Figure 15:
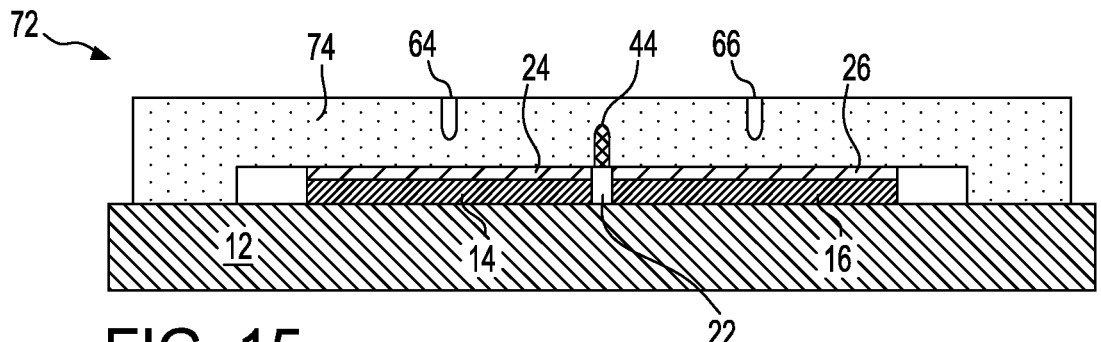

In FIG. 15, multi-chip module 72 has a slot 44 in the underside of the lid 74 over the gap 22 between semiconductor chips 14, 16 and slots 64, 66 over the centerlines of semiconductor chips 14, 16, respectively.

Figure 16:
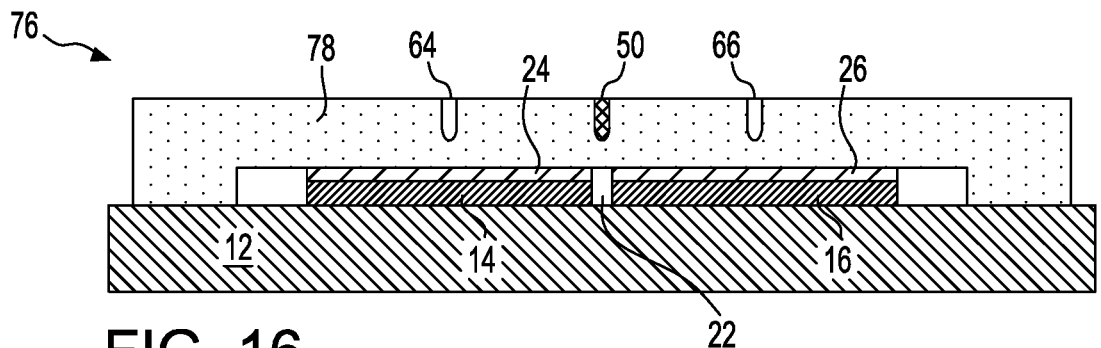

In FIG. 16, multi-chip module 76 has a slot 50 in the topside of the lid 78 over the gap 22 between semiconductor chips 14, 16 and slots 64, 66 over the centerlines of semiconductor chips 14, 16, respectively.

Figure 17:
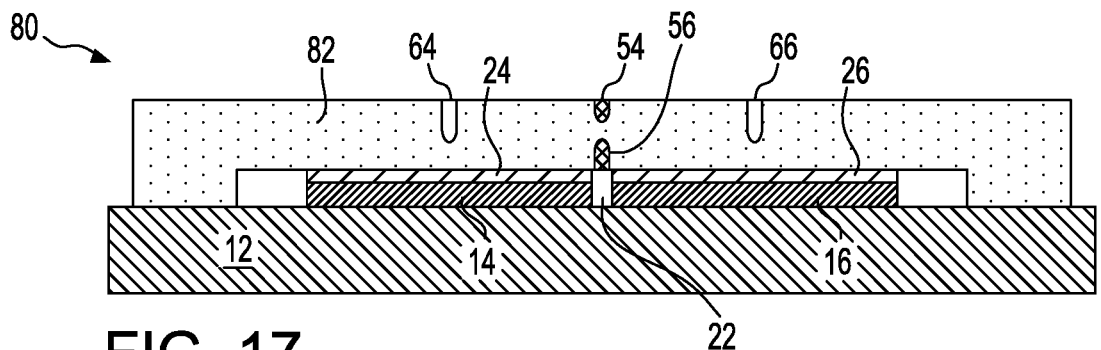
Figure 18:
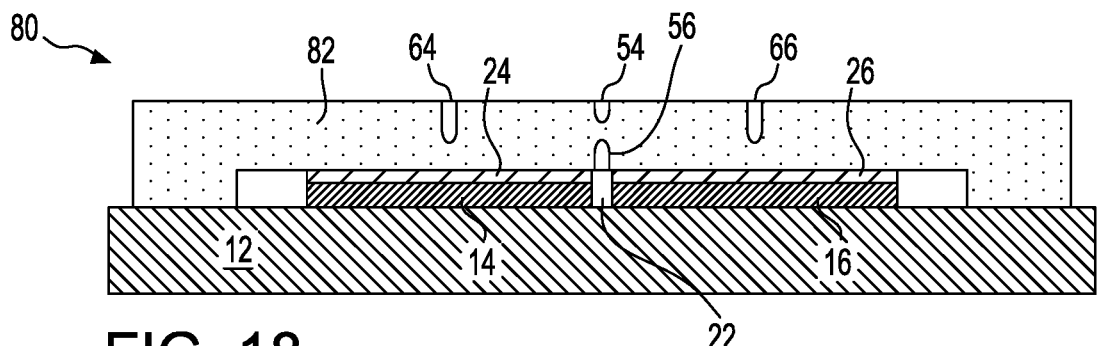

In FIG. 17, multi-chip module 80 has a slot 56 in the underside of the lid 82 and a slot 54 in the topside of the lid 82 over the gap 22 between semiconductor chips 14, 16 and slots 64, 66 over the centerline of semiconductor chips 14, 16, respectively.

In each of FIGS. 15 to 17, the slots 44, 50, 54, 56 may be filled with indium, a thermal gel or a thermal paste. In each of FIGS. 15 to 17, the slots 44, 50, 54, 56 may be unfilled. One example of unfilled slots is in FIG. 18 where multi-chip module 80 has the slots 54, 56 unfilled.

Figure 19:
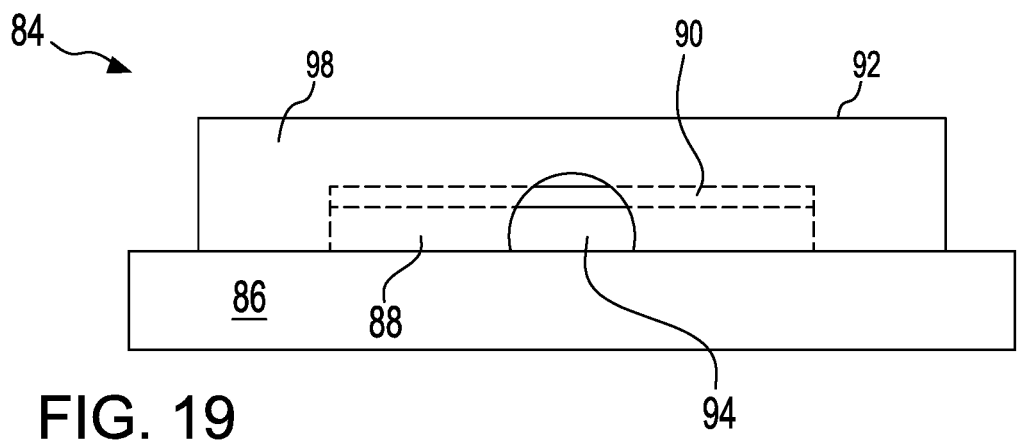
Figure 20:
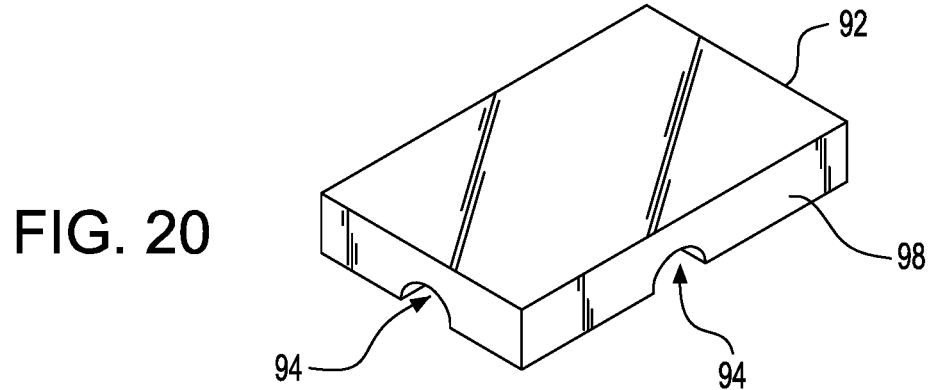
Figure 21:
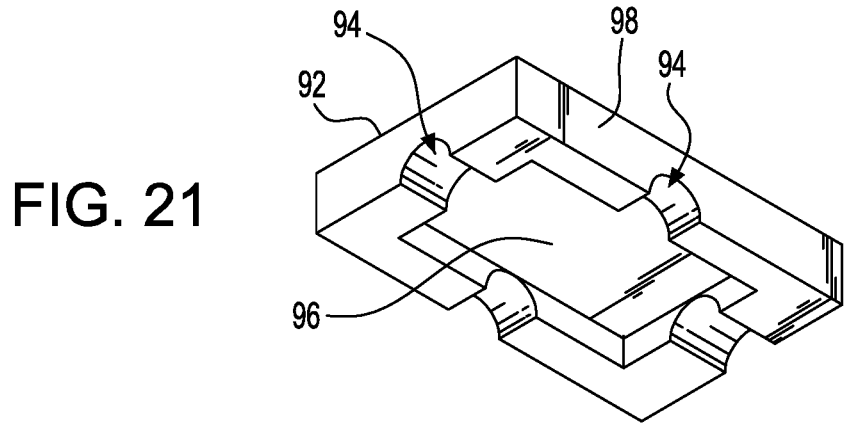

Referring now to FIGS. 19 to 21, there is disclosed another exemplary embodiment in which one or more slots in the lid provide at least one zone of reduced bending rigidity. This exemplary embodiment pertains to a single-chip module.

Referring first to FIG. 19, there is illustrated an elevation view of single-chip module 84 that includes an electronics substrate 86, such as an organic laminate material, semiconductor chip 88, TIM 90 and lid 92 covering the semiconductor chip 88. The lid 92 may be attached to the electronics substrate 86 by a seal band (not shown). The lid 92 is typically a rigid metallic material such as copper or aluminum.

FIGS. 20 and 21 are perspective views illustrating the lid 92 in more detail. The lid 92 has notches 94 in the sides 98. The notches 94 align with the centerline of the chip 88. There may be notches only on two sides 98 of the lid 92 or on all four sides of the lid 92 as shown in FIGS. 20 and 21. When the notches 94 are on all four sides of the lid 92, then the notches 94 align with the centerlines of the chip 88 in both the width and length of the chip 88. The underside 96 of lid 92 is in contact with TIM 90 when the lid 92 is assembled into the single-chip module 84.

The notches 94 serve to reduce the rigidity of the lid 92 and further, reduce the TIM peeling effect.

The TIMs 24, 26, 90 in FIGS. 3 to 19 should comprise a material that remains intact, meaning it doesn't delaminate in the form of either cohesive or adhesive failure at low temperature, say −55° C., up to semiconductor chip reflow. Such TIMS 24, 26, 90 may be a thermal grease or a thermal gel or a soft metal such as indium. Rigid materials such as solder are not used because they may eliminate the possibility of the at least one zone of reduced bending rigidity.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. An electronic apparatus comprising:
a semiconductor device mounted to an electronic packaging substrate for receiving the semiconductor device; and
one-piece lid secured to the electronic packaging substrate and covering the semiconductor device, the one-piece lid having a zone of targeted flexibility,
wherein the lid comprises at least two opposed sides projecting from the lid in a direction perpendicular to a surface of the electronic packaging substrate, and wherein the zone of targeted flexibility comprises a notch in each of the two opposed sides such that the notches are aligned with each other and with a centerline of the semiconductor device.

2. The electronic apparatus of claim 1 wherein the lid comprises a third side and a fourth side opposed to the third side projecting from the lid in a direction perpendicular to the surface of the electronic packaging substrate, and wherein the zone of targeted flexibility further comprises a notch in each of the third and fourth opposed sides such that the notches in the third and fourth sides are aligned with each other and with a second centerline of the semiconductor device.

3. The electronic apparatus of claim 1 wherein the zone of targeted flexibility is a designed area at one or more targeted locations of the lid to increase flexibility of the lid at the one or more targeted locations of the lid.

4. An electronic apparatus comprising:
a plurality of semiconductor devices mounted to an electronic packaging substrate, the plurality of semiconductor devices placed closely to one another so that a gap between a pair of semiconductor devices is between 0.5 and 3 mm;
a lid having at least one zone of targeted flexibility directly over the gap between the pair of semiconductor devices; and
a first slot and a second slot each parallel to and spaced from the gap, the first slot being directly over a first semiconductor device of the pair of semiconductor devices and the second slot being directly over a second semiconductor device of the pair of semiconductor devices.

5. The electronic apparatus of claim 4 wherein the zone of targeted flexibility comprises a hinge that is parallel to the gap and is directly over the gap.

6. The electronic apparatus of claim 4 wherein the zone of targeted flexibility comprises a third slot that is parallel to the gap and is directly over the gap.

7. The electronic apparatus of claim 6 wherein the third slot is on a surface of the lid facing the plurality of semiconductor devices.

8. The electronic apparatus of claim 6 wherein the third slot is on a surface of the lid facing away from the plurality of semiconductor devices.

9. The electronic apparatus of claim 6 wherein the zone of targeted flexibility further comprising a fourth slot that is parallel to the gap and is directly over the gap such that the third slot is in a surface of the lid facing the plurality of semiconductor devices and the fourth slot is in a surface of the lid facing away from the plurality of semiconductor devices.

10. The electronic apparatus of claim 6 wherein the third slot is 30 to 90% of a thickness of the lid.

11. The electronic apparatus of claim 6 wherein the fourth slot is 30 to 90% of a thickness of the lid.

12. The electronic apparatus of claim 4 wherein the first slot and the second slot are in a surface of the lid facing away from the plurality of semiconductor devices and are over centerlines of the first semiconductor device and the second semiconductor device.

13. The electronic apparatus of claim 4 wherein the at least one zone of targeted flexibility is a designed area at one or more targeted locations of the lid to increase flexibility of the lid at the one or more targeted locations of the lid.

14. An electronic apparatus comprising:
a plurality of semiconductor devices mounted to an electronic packaging substrate, the plurality of semiconductor devices placed closely to one another so that a gap between a pair of semiconductor devices is between 0.5 and 3 mm; and
a lid having at least one zone of targeted flexibility directly over the gap between the pair of semiconductor devices.

15. The electronic apparatus of claim 14 wherein the zone of targeted flexibility comprises a hinge that is parallel to the gap and is directly over the gap.

16. The electronic apparatus of claim 14 wherein the zone of targeted flexibility comprises a first slot that is parallel to the gap and is directly over the gap.

17. The electronic apparatus of claim 16 wherein the first slot is on a surface of the lid facing the plurality of semiconductor devices.

18. The electronic apparatus of claim 16 wherein the first slot is on a surface of the lid facing away from the plurality of semiconductor devices.

19. The electronic apparatus of claim 16 wherein the zone of targeted flexibility further comprising second slot that is parallel to the gap and is directly over the gap such that the first slot is in a surface of the lid facing the plurality of semiconductor devices and the second slot is in a surface of the lid facing away from the plurality of semiconductor devices.

20. The electronic apparatus of claim 16 wherein the first slot is 30 to 90% of a thickness of the lid, and wherein the second slot is 30 to 90% of a thickness of the lid.

* * * * *